United States Patent
Chen et al.

(10) Patent No.: US 6,853,012 B2
(45) Date of Patent: Feb. 8, 2005

(54) ALGAINP LIGHT EMITTING DIODE

(75) Inventors: Nai-Chuan Chen, Taipei (TW); Yi-Lun Chou, Taipei (TW); Nae-Guann Yih, Tao-Yuan (TW)

(73) Assignee: Uni Light Technology Inc., Tao-Yuan (TW)

( * ) Notice: Subject to any disclaimer, the term of this patent is extended or adjusted under 35 U.S.C. 154(b) by 151 days.

(21) Appl. No.: 10/274,174

(22) Filed: Oct. 21, 2002

(65) Prior Publication Data

US 2004/0075102 A1 Apr. 22, 2004

(51) Int. Cl.$^7$ .............................................. H01L 21/20
(52) U.S. Cl. ........................ 257/103; 257/101; 257/79
(58) Field of Search .............................. 257/76, 78, 79, 257/89–90, 101–103

(56) References Cited

U.S. PATENT DOCUMENTS 5,706,306 A * 1/1998 Jiang et al. .................... 372/96
5,719,892 A * 2/1998 Jiang et al. .................... 372/45
5,719,893 A * 2/1998 Jiang et al. .................... 372/45

* cited by examiner

Primary Examiner—Minhloan Tran
Assistant Examiner—Thomas L Dickey
(74) Attorney, Agent, or Firm—Rosenberg, Klein & Lee

(57) ABSTRACT

An AlGaInP light emitting diode with improved illumination is provided. The AlGaInP light emitting diode includes a semiconductor substrate, a light re-emitting layer, an AlGaInP layer with a first doping concentration, an AlGaInP lower cladding layer with a second doping concentration less than the first doping concentration, an undoped AlGaInP active layer, an AlGaInP upper cladding layer, a window layer, an annular-shaped top electrode on the window layer and a layered electrode on a bottom of the semiconductor substrate. The light re-emitting layer includes at least a first region formed of the light re-emitting layer and a second region formed of $Al_2O_3$ enclosing the first region. Since AlGaInP layer between the AlGaInP lower cladding layer and the light re-emitting layer has the first doping concentration larger than that of the AlGaInP lower cladding layer, the AlGaInP layer provides a transverse current spreading. The $Al_2O_3$ region also improves light reflection illuminating on the light re-emitting layer. As a result, the brightness performance of the light emitting diode is improved.

15 Claims, 5 Drawing Sheets

ALGAINP LIGHT EMITTING DIODE

BACKGROUND OF THE INVENTION

1. Field of the Invention

The present invention relates to a semiconductor light emitting diode, and more particularly to an AlGaInP light emitting diode with improved illumination.

2. Description of the Prior Art

The light emitting diode (LED) has been studied and developed for over forty years from DC 1960. From a conventional light emitting diode to a current high brightness light emitting diode, the light emitting diodes have been broadly used, such as traffic signals, car indicator lamps, colorful outside screens and even application in illumination in the future.

Although the internal quantum efficiency of the light emitting diode can be improved to 90 percent and even more by the current epitaxial technique, the external quantum efficiency of the high brightness light emitting diode has an efficiency of only 10 percent or lower. Thus, efficiency is a very important issue. Improvements in the light generated within the light emitting diode and the brightness thereof by means of various structures and the methods for fabrication is a highly sought after result.

Referring to FIG. 1, which is a cross-sectional view of a prior $(Al_xGa_{1-x})_{0.5}In_{0.5}P$ light emitting diode 10. The $(Al_xGa_{1-x})_{0.5}In_{0.5}P$ light emitting diode 10 comprises an N type GaAs substrate 101 with a thickness about 200 μm, an N type distributed bragg reflector (DBR) 102, an $(Al_xGa_{1-x})_{0.5}In_{0.5}P$ light-emitting layer 103, a P type GaP window layer 104, a P type top electrode 105 and an N type bottom electrode 106.

The N type distributed bragg reflector (DBR) 102 can be an N type $AlAs/Al_xGa_{1-x}As$ based DBR, an N type $AlAs/In_{0.5}(Ga_{1-x}Al_x)_{0.5}P$ based DBR, and an N type $In_{0.5}(Ga_{1-x}Al_x)_{0.5}P$ based DBR. The purpose of the N type distributed bragg reflector 102 is to reflect the emitting light from the $(Al_xGa_{1-x})_{0.5}In_{0.5}P$ light-emitting layer 103.

The $(Al_xGa_{1-x})_{0.5}In_{0.5}P$ light-emitting layer 103 includes an N type $(Al_xGa_{1-x})_{0.5}In_{0.5}P$ lower cladding layer, an undoped $(Al_xGa_{1-x})_{0.5}In_{0.5}P$ active layer and a P type $(Al_xGa_{1-x})_{0.5}In_{0.5}P$ upper cladding layer. The purpose of the N type $(Al_xGa_{1-x})_{0.5}In_{0.5}P$ lower cladding layer and the P type $(Al_xGa_{1-x})_{0.5}In_{0.5}P$ upper cladding layer is for carrier injection into the $(Al_xGa_{1-x})_{0.5}In_{0.5}P$ light-emitting layer 103 and carrier confinement in the $(Al_xGa_{1-x})_{0.5}In_{0.5}P$ light-emitting layer 103. The thickness of both of the N type $(Al_xGa_{1-x})_{0.5}In_{0.5}P$ lower cladding layer and the P type $(Al_xGa_{1-x})_{0.5}In_{0.5}P$ upper cladding layer should be thicker than the diffusion length of the injection carriers to prevent the carrier diffusion from the $(Al_xGa_{1-x})_{0.5}In_{0.5}P$ light-emitting layer 103 into the cladding layers.

The P type GaP window layer 104 is used to more efficiently spread the current and facilitating the light emission from the $(Al_xGa_{1-x})_{0.5}In_{0.5}P$ light-emitting layer 103 so as to improve light extraction of the light emitting diode.

The P type top electrode 105 is formed on the central portion of the P type GaP window layer 104. The front shape of the P type top electrode 105 is generally rounded or formed of other shapes. The N type bottom electrode 106 is formed on a bottom of the N type GaAs substrate 101.

The $(Al_xGa_{1-x})_{0.5}In_{0.5}P$ light emitting diode 10 is a PN junction with a forward bias to inject holes from the P type $(Al_xGa_{1-x})_{0.5}In_{0.5}P$ upper cladding layer and electrons from the N type $(Al_xGa_{1-x})_{0.5}In_{0.5}P$ lower cladding layer into the undoped $(Al_xGa_{1-x})_{0.5}In_{0.5}P$ active layer. The undoped $(Al_xGa_{1-x})_{0.5}In_{0.5}P$ active layer emits visible light due to the recombination of the electrons and holes in this active layer.

FIG. 2 is a schematic diagram of current distribution within the $(Al_xGa_{1-x})_{0.5}In_{0.5}P$ light emitting diode 10 of FIG. 1. The P type top electrode 105 is a rounded electrode formed on the central portion of the P type GaP window layer 104. The current density under the P type top electrode 105 is highest. However, a part of light generated under the P type top electrode 105 is absorbed. Another part of the light generated under the P type top electrode 105 is reflected back into the light emitting diode chip. And, most of the light reflected back into the light emitting diode chip is absorbed. Therefore, the structure of the prior $(Al_xGa_{1-x})_{0.5}In_{0.5}P$ light emitting diode 10 adversely influence brightness performance of the light emitting diode.

Accordingly, it is an intention to develop an improved structure of a light emitting diode, which can prevent current passing through the region under a top electrode so as to resolve the drawback of the prior light emitting diode.

SUMMARY OF THE INVENTION

It is an objective of the present invention to provide an AlGaInP light emitting diode, which provides an additional doped AlGaInP layer between a distributed bragg reflector and an AlGaInP illuminating layer. By way of doping the additional AlGaInP layer with a dopant concentration larger than that of an AlGaInP lower cladding layer of the AlGaInP illuminating layer or making the additional doped AlGaInP layer thicker than the AlGaInP lower cladding layer, the additional doped AlGaInP layer provides a transverse current spreading. As a result, the light-emitting region occupies the whole area of the AlGaInP light emitting diode. The brightness performance of the AlGaInP light emitting diode is thus improved.

It is another objective of the present invention to provide an AlGaInP light emitting diode, which provides an annular-shaped top electrode on a window layer thereof in order that the light emits from an AlGaInP illuminating layer would not be blocked by the top electrode. The brightness performance of the AlGaInP light emitting diode can be improved.

It is a further objective of the present invention to provide an AlGaInP light emitting diode with a light re-emitting layer including at least a first region formed of the light re-emitting layer and a second region of $Al_2O_3$ enclosing the first region. Since the refractive index of $Al_2O_3$ is much less than that of the AlGaInP illuminating layer, the light illuminating on the second region of $Al_2O_3$ from the AlGaInP illuminating layer can completely reflect back so as to improve the brightness performance of the AlGaInP light emitting diode.

In order to achieve the above objectives, the present invention provides an AlGaInP light emitting diode including a semiconductor substrate with a first conductivity, a light re-emitting layer with the first conductivity on the semiconductor substrate, an AlGaInP layer with the first conductivity and having a first doping concentration on the light re-emitting layer, an AlGaInP lower cladding layer with the first conductivity and having a second doping concentration less than the first doping concentration on the AlGaInP layer, an undoped AlGaInP active layer on the AlGaInP lower cladding layer, an AlGaInP upper cladding layer with a second conductivity opposite to the first conductivity on the undoped AlGaInP active layer, a window layer with the second conductivity on the AlGaInP upper cladding layer, an annular-shaped top electrode with the second conductivity on the window layer and a layered electrode with the first conductivity on a bottom of the semiconductor substrate. Since the doping concentration of the AlGaInP layer is larger than that of the AlGaInP lower cladding layer, the AlGaInP layer would provide a transverse current spreading. As a result, the light-emitting region occupies the whole area of the AlGaInP light emitting diode. The brightness performance of the AlGaInP light emitting diode is thus improved.

BRIEF DESCRIPTION OF THE DRAWINGS

The present invention can be best understood through the following description and accompanying drawings, wherein.

DESCRIPTION OF THE PREFERRED EMBODIMENTS

The present invention provides an AlGaInP light emitting diode with improved illumination, which forms an annular-shaped top electrode on a window layer of the AlGaInP light emitting diode such that the light emitting from the AlGaInP light emitting diode would not be blocked by the top electrode. Meanwhile, the present invention inserts an additional doped AlGaInP layer between a distributed bragg reflector and an AlGaInP illuminating layer of the AlGaInP light emitting diode. The additional doped AlGaInP layer provides a transverse current spreading so that the light-emitting region occupies the whole area of the AlGaInP illuminating layer. The illumination of the AlGaInP light emitting diode thus can be improved. The present invention also forms $Al_2O_3$ portions in the distributed bragg reflector. The refractive index of $Al_2O_3$ is about 1.55, and the refractive index of the AlGaInP illuminating layer is about 3~3.5. The refractive index of $Al_2O_3$ is much less than that of the AlGaInP illuminating layer, making the light illuminating on the $Al_2O_3$ portions of the distributed bragg reflector will completely reflect back. By the above ways, the brightness performance of the present AlGaInP light emitting diode can be improved.

The AlGaInP light emitting diode of the present invention will be described in detail in the following according to preferred embodiments with reference to the accompanying drawings.

Figure 1:
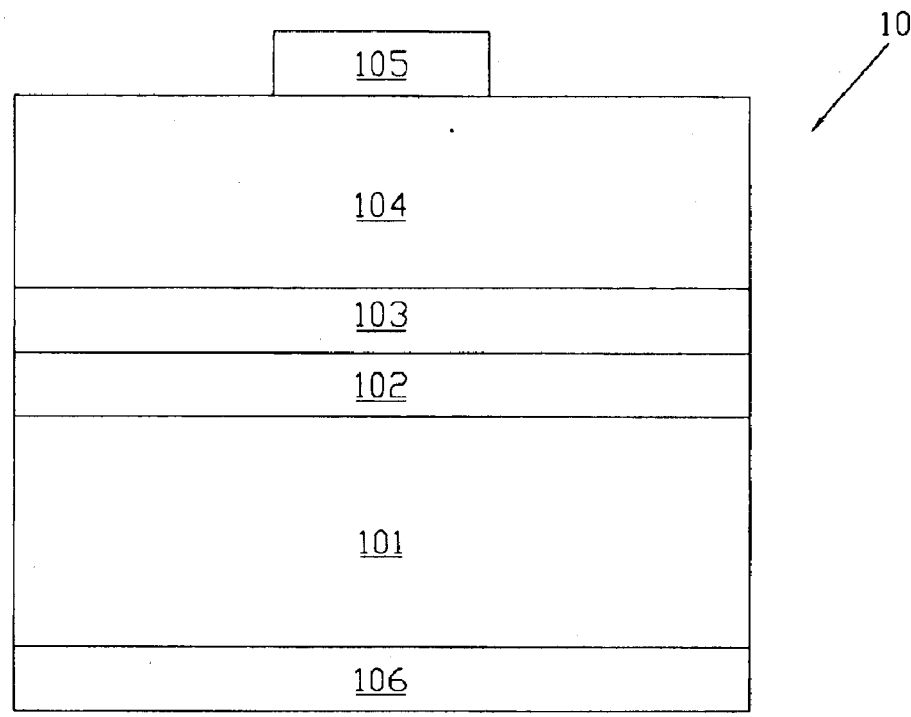
FIG. 1 is a schematic cross-sectional view of a prior $(Al_xGa_{1-x})_{0.5}In_{0.5}P$ light emitting diode.
Figure 2:
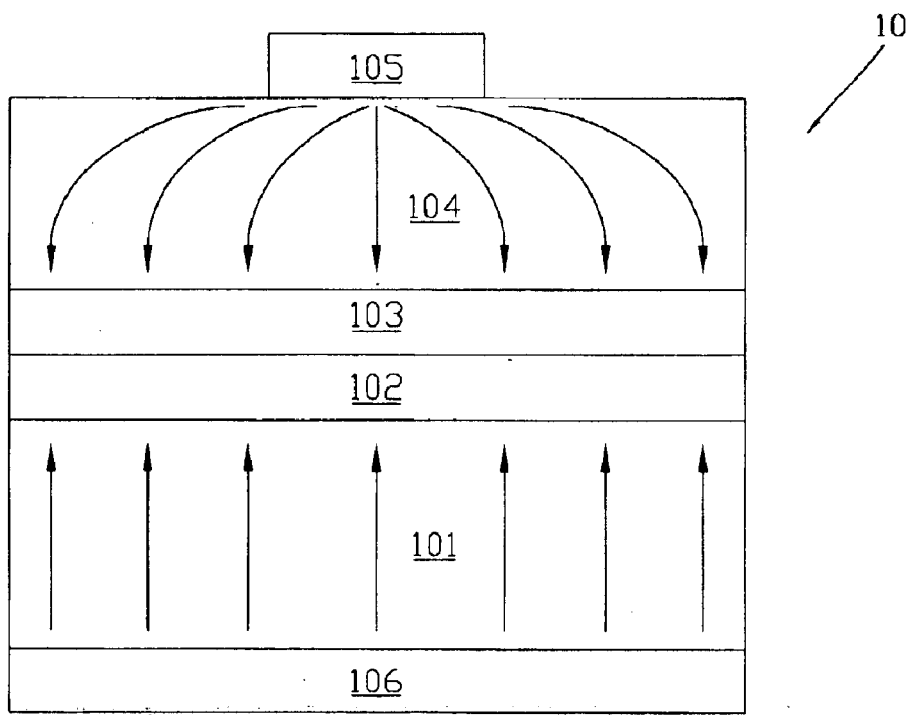
FIG. 2 is schematic view of current distribution within the prior $(Al_xGa_{1-x})_{0.5}In_{0.5}P$ light emitting diode of FIG. 1.
Figure 3:
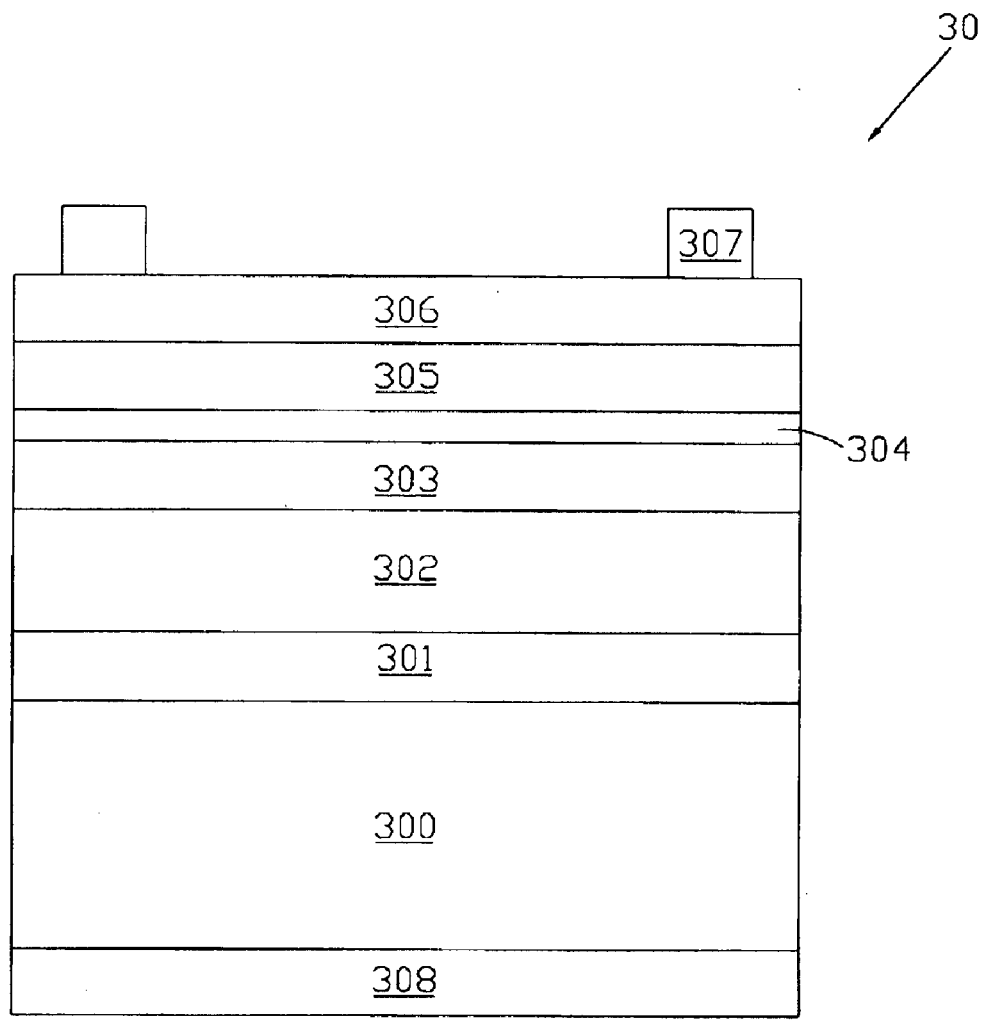
FIG. 3 is a schematic cross-sectional view of an AlGaInP light emitting diode structure according to a first preferred embodiment of the present invention.

FIG. 3 is a schematic cross-sectional view of an AlGaInP light emitting diode structure 30 according to a first preferred embodiment of the present invention. The AlGaInP light emitting diode structure 30 includes an N type semiconductor substrate 300, an N type distributed bragg reflector 301, an N type AlGaInP layer 302 with a first doping concentration, an N type AlGaInP lower cladding layer 303 with a second doping concentration less than the first doping concentration, an undoped AlGaInP active layer 304, a P type AlGaInP upper cladding layer 305 and a P type GaP window layer 306 with a thickness about 10 $\mu$m.

The N type semiconductor substrate 300 can be an N type GaAs substrate with a thickness about 200 $\mu$m. The N type distributed bragg reflector 301 is an N type $AlAs/Al_xGa_{1-x}As$ light re-emitting layer formed on the N type semiconductor substrate 300. The N type AlGaInP lower cladding layer 303, undoped AlGaInP active layer 304 and P type AlGaInP upper cladding layer 305 constitute an AlGaInP illuminating layer. And, the N type AlGaInP 302 is inserted between the N type distributed bragg reflector 301 and the N type AlGaInP lower cladding layer 303. It is preferable that the N type AlGaInP lower cladding layer 303 is an N type $In_{0.5}(Ga_{1-x}Al_x)_{0.5}P$ lower cladding layer with a doping concentration about $1\times10^{17}$ ions/cm$^3$, the undoped AlGaInP layer 304 is an undoped $In_{0.5}(Ga_{1-x}Al_x)_{0.5}P$ active layer and the P type AlGaInP upper cladding layer 305 is a P type $In_{0.5}(Ga_{1-x}Al_x)_{0.5}P$ upper cladding layer with a doping concentration about $1\times10^{17}$ ions/cm$^3$. And, the N type AlGaInP layer 302 is preferably an N type $In_{0.5}(Ga_{1-x}Al_x)_{0.5}P$ layer with a doping concentration not less than $1\times10^{18}$ ions/cm$^3$. The P type GaP window layer 306 is formed on the P type $In_{0.5}(Ga_{1-x}Al_x)_{0.5}P$ upper cladding layer 305. Furthermore, a P type annular-shaped top electrode 307 is formed on the P type GaP window layer 306 of the AlGaInP light emitting diode structure 30.

The process for forming the P type annular-shaped top electrode 307 is described in the following. The chip having been cleaned is sent in a photolithography room, and an IC59 negative photoresist is coated on the chip. Placing an annular-shaped mask on the negative photoresist, then proceeding with the steps, soft bake, exposure, development and hard bake to form a desired annular-shaped pattern on the negative photoresist. Next, the chip is placed in a thermal-resistant vapor sputtering machine to deposit AuBe/Au with a thickness about 3000 angstroms to 5000 angstroms on the chip. After that, the chip is immersed in acetone to remove the negative photoresist and leave the annular-shaped AuB/Au. Then, the chip is cleaned with methanol and ionized water, and purged with nitrogen gas. As a result, the P type annular-shaped top electrode 307 is formed on the P type GaP window layer 306 of the AlGaInP light emitting diode structure 30. An N type layered electrode 308 is formed on a bottom of the N type semiconductor substrate 300. The chip having been cleaned is placed in a thermal-resistant vapor sputtering machine to deposit AuGe/Ni with a thickness about 2000 angstroms on the bottom of the N type semiconductor substrate 300 to serve as the N type layered electrode 308.

Referring to FIG. 3 the N type AlGaInP layer 302 has the first doping concentration more than the second doping concentration of the N type AlGaInP lower cladding layer 303. The N type AlGaInP layer 302 would provide a transverse current spreading so as to make the light-emitting region occupies the whole area of the AlGaInP light illuminating layer. Furthermore, the annular-shaped top electrode 307 would not block the light emitting from the AlGaInP illuminating layer. The brightness performance of the AlGaInP light emitting diode 30 is thus improved by the P type annular-shaped top electrode 307 associating with the N type AlGaInP layer 302 with a transverse current spreading.

By the way, the first doping concentration of the N type AlGaInP layer 302 can be the same with the second doping concentration of the N type AlGaInP lower cladding layer 303, and making the N type AlGaInP layer 302 thicker than the N type AlGaInP lower cladding layer 303. Thus, the N type AlGaInP layer 302 also can provide a transverse current spreading.

Figure 4:
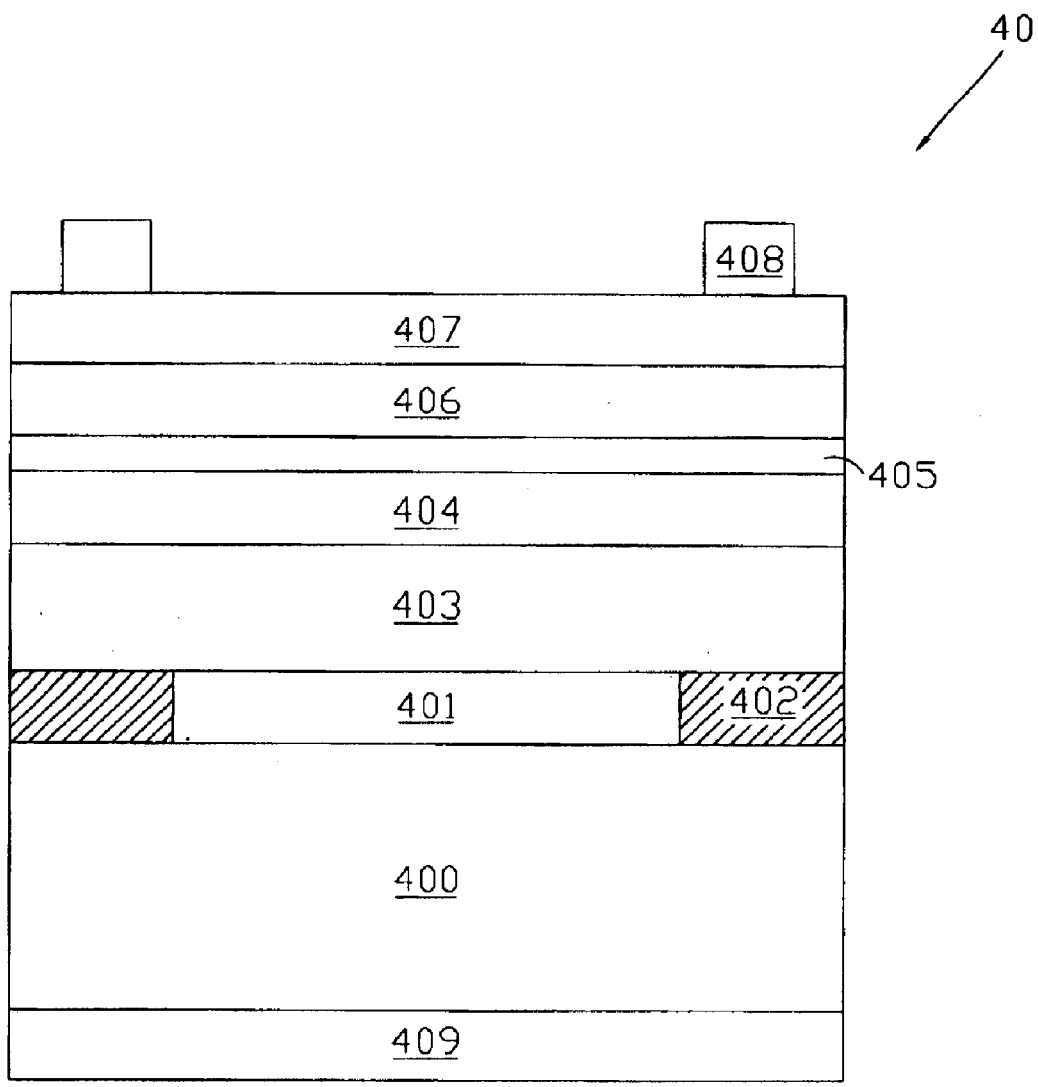
FIG. 4 is a schematic cross-sectional view of an AlGaInP light emitting diode structure according to a second preferred embodiment of the present invention.

FIG. 4 is a schematic cross-sectional view of an AlGaInP light emitting diode structure 40 according to a second preferred embodiment of the present invention. The AlGaInP light emitting diode structure 40 includes an N type semiconductor substrate 400, an N type distributed bragg reflector 401 having an annular-shaped $Al_2O_3$ region 402 on the periphery thereof, an N type AlGaInP layer 403 with a first doping concentration, an N type AlGaInP lower cladding layer 404 with a second doping concentration less than the first doping concentration, an undoped AlGaInP active layer 405, a P type AlGaInP upper cladding layer 406 and a P type GaP window layer 407. A P-type annular-shaped top electrode 408 is formed on the P type GaP window layer 407, and a N type layered electrode 409 is formed on a bottom of the N type semiconductor substrate 400.

The structure and materials of the AlGaInP light emitting diode 40 are mostly the same with those of the AlGaInP light emitting diode 30 except that the annular-shaped $Al_2O_3$ region 402 is formed on the periphery of the N type distributed bragg reflector 401. The refractive index of $Al_2O_3$ is about 1.55 and the N type AlGaInP layer 403 is about 3~3.5. The refractive index of $Al_2O_3$ is much less than that of the N type AlGaInP layer 403, resulting in the light illuminating on the annular-shaped $Al_2O_3$ region 402 from the AlGaInP illuminating layer completely reflects back.

In the second preferred embodiment, the annular-shaped $Al_2O_3$ region 402 can be formed by way of wet oxidation. The AlGaInP light emitting diode 40 is placed in an oven at a temperature about 400° C.~440° C. Aqueous vapor is fed into the oven by a carrier gas of nitrogen gas with a flow rate about 1 to 5 liter/per minute. The oxidation time is about 1.5 hours to 3.5 hours. During the wet oxidation, AlAs and $Al_xGa_{1-x}As$ of the N type distributed bragg reflector 401 are oxidized. The major product is $Al_2O_3$. During the wet oxidation, the whole chip is placed in the oven and the sides of the N type distributed bragg reflector 401 is directly exposed in aqueous vapor. Therefore, the oxidation begins from the sides of the N type distribute bragg reflector 401, thus forming an annular-shaped $Al_2O_3$ region 402 on a peripheral region of the N type distributed bragg reflector 401.

The N type AlGaInP layer 403 provides a transverse current spreading to make the light-emitting region occupy the whole area of the AlGaInP illuminating layer, the annular-shaped $Al_2O_3$ region 402 can completely reflect back the light from the AlGaInP illuminating layer, and the annular-shaped top electrode 408 does not block the light emitting from the AlGaInP illuminating layer. Therefore, the brightness performance of the AlGaInP light emitting diode 40 can be further improved.

Figure 5:
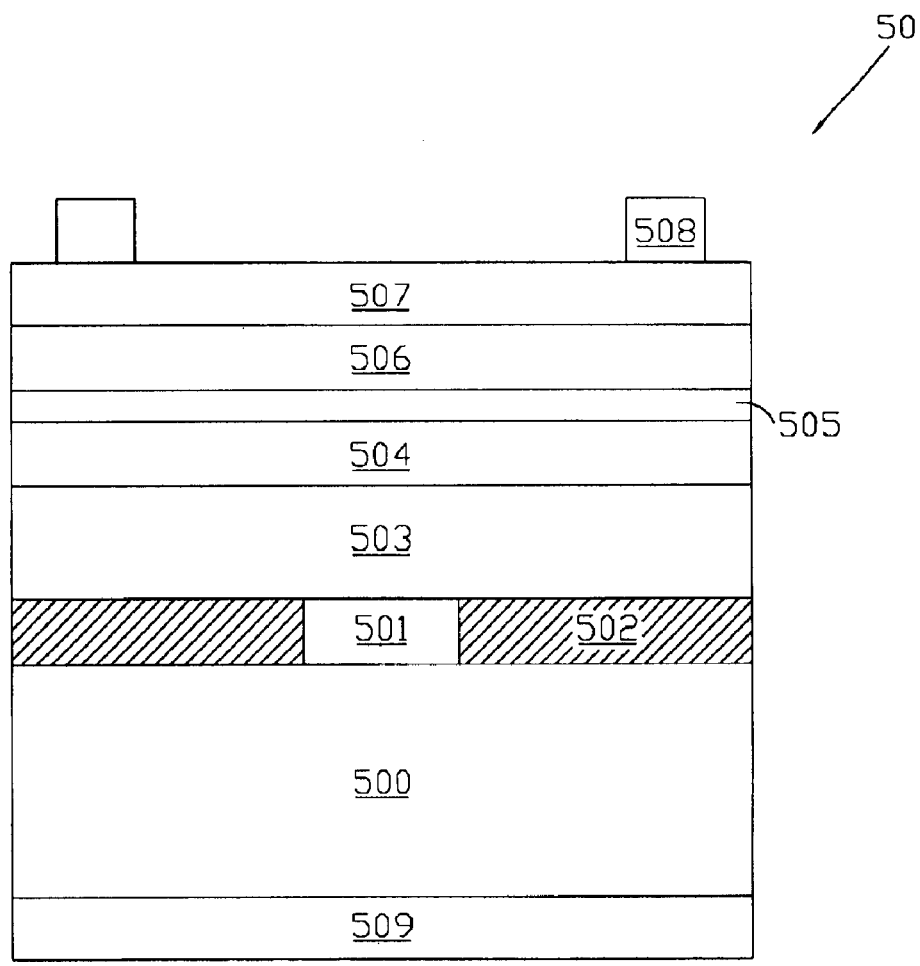
FIG. 5 is a schematic cross-sectional view of an AlGaInP light emitting diode structure according to a third preferred embodiment of the present invention.

FIG. 5 is a schematic cross-sectional view of an AlGaInP light emitting diode structure 50 according to a third preferred embodiment of the present invention. The AlGaInP light emitting diode structure 50 includes an N type semiconductor substrate 500, an N type distributed bragg reflector including a first region 501 formed of N type AlAs/$Al_xGa_{1-x}As$ light re-emitting layer and a second region of $Al_2O_3$ 502 enclosing the first region 501, an N type AlGaInP layer 503 with a first doping concentration, an N type AlGaInP lower cladding layer 504 with a second doping concentration less than the first doping concentration, an undoped AlGaInP active layer 505, a P type AlGaInP upper cladding layer 506 and a P type GaP window layer 507. A P-type annular-shaped top electrode 508 is formed on the P type GaP window layer 507, and a P type layered electrode 509 is formed on a bottom of the N type semiconductor substrate 500.

The structure and materials of the AlGaInP light emitting diode 50 is mostly the same with those of the AlGaInP light emitting diode 40, but instead of an annular-shaped $Al_2O_3$ region formed on the periphery of the distributed bragg reflector, the distributed bragg reflector of the AlGaInP light emitting diode 50 includes a first region 501 formed of N type AlAs/$Al_xGa_{1-x}As$ light re-emitting layer and a second region of $Al_2O_3$ 502 enclosing the first region 501.

Figure 6:
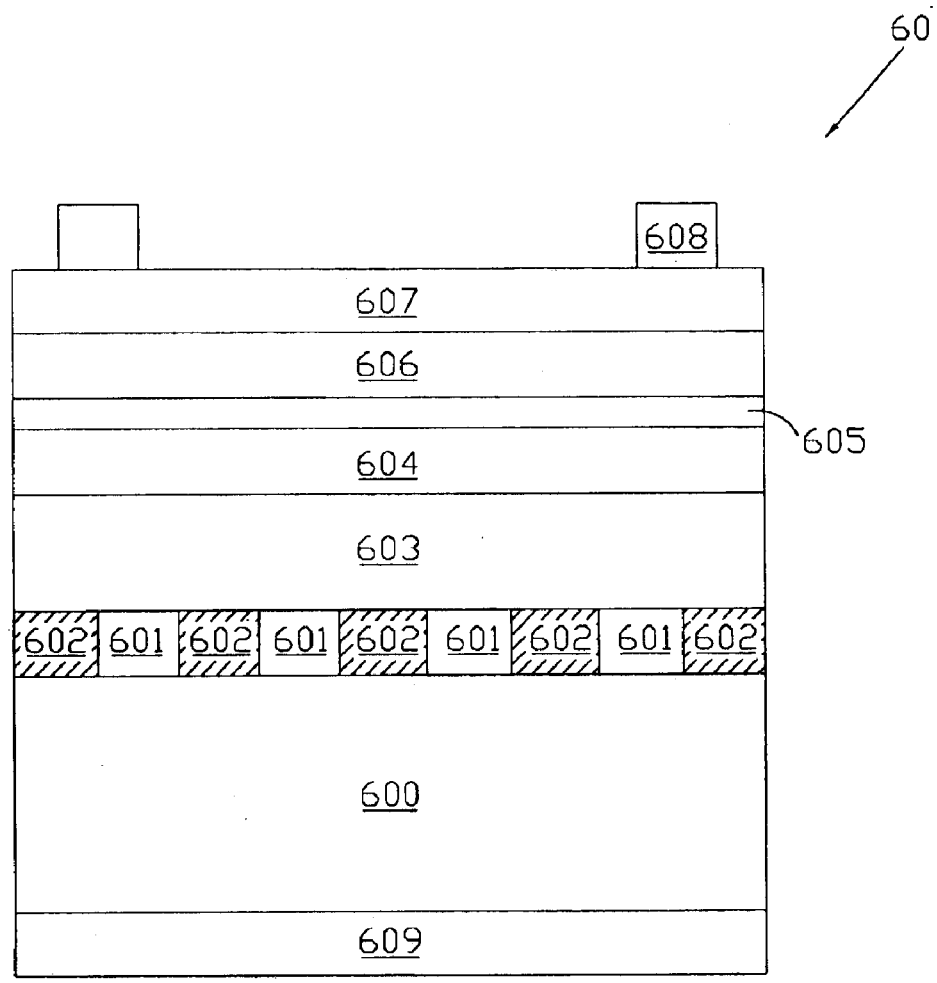
FIG. 6 is a schematic cross-sectional view of an AlGaInP light emitting diode structure according to a fourth preferred embodiment of the present invention.

FIG. 6 is a schematic cross-sectional view of an AlGaInP light emitting diode structure 60 according to the fourth preferred embodiment of the present invention. The AlGaInP light emitting diode structure 60 includes an N type semiconductor substrate 600, an N type distributed bragg reflector including a plurality of first regions 601 formed of N type AlAs/$Al_xGa_{1-x}As$ light re-emitting layer and a second region of $Al_2O_3$ 602 enclosing the first regions 601, an N type AlGaInP layer 603 with a first doping concentration, an N type AlGaInP lower cladding layer 604 with a second doping concentration less than the first doping concentration, an undoped AlGaInP active layer 605, a P type AlGaInP upper cladding layer 606 and a P type GaP window layer 607. A P-type annular-shaped top electrode 608 is formed on the P type GaP window layer 607, and a P type layered electrode 609 is formed on a bottom of the N type semiconductor substrate 600.

The structure and materials of the AlGaInP light emitting diode 60 are mostly the same with those of the AlGaInP light emitting diode 50. While the distributed bragg reflector of the AlGaInP light emitting diode 60 includes a plurality of first regions 601 formed of N type AlAs/$Al_xGa_{1-x}As$ light re-emitting layer and a second region of $Al_2O_3$ 602 enclosing the several first regions 601.

The conductivity of the semiconductor substrate of the present light emitting diode can be substituted with the opposite conductivity, and the conductivity of the other layers of the present light emitting diode are changed accordingly.

The preferred embodiments are only used to illustrate the present invention, not intended to limit the scope thereof. Many modifications of the preferred embodiments can be made without departing from the spirit of the present invention.

What is claimed is:
1. An AlGaInP light emitting diode, comprising:
a semiconductor substrate with a first conductivity;
a light re-emitting layer with said first conductivity on said semiconductor substrate;
an AlGaInP layer with said first conductivity and having a first doping concentration on said light re-emitting layer;
an AlGaInP lower cladding layer with said first conductivity and having a second doping concentration less than said first doping concentration on said AlGaInP layer;
an undoped AlGaInP active layer on said AlGaInP lower cladding layer;
an AlGaInP upper cladding layer with a second conductivity opposite to said first conductivity on said undoped AlGaInP active layer;

a window layer with said second conductivity on said AlGaInP upper cladding layer;

an annular-shaped top electrode with said second conductivity on said window layer; and a layered electrode with said first conductivity on a bottom of said semiconductor substrate, wherein said AlGaInP layer with said first conductivity and said first doping concentration has a thickness not less than that of said AlGaInP lower cladding layer.

2. The AlGaInP light emitting diode of claim 1, wherein further comprising an annular-shaped $Al_2O_3$ region on a peripheral region of said light re-emitting layer.

3. The AlGaInP light emitting diode of claim 1, wherein said light re-emitting layer comprises a first region formed of said light re-emitting layer and a second region formed of $Al_2O_3$ enclosing said first region.

4. The AlGaInP light emitting diode of claim 1, wherein said light re-emitting layer comprises a first region formed of $Al_2O_3$ and a plurality of second regions of said light re-emitting layer formed in said first region.

5. The AlGaInP light emitting diode of claim 1, wherein said semiconductor substrate comprises GaAs.

6. The AlGaInP light emitting diode of claim 1, wherein said light re-emitting layer comprises $AlAs/Al_xGa_{1-x}As$.

7. The AlGaInP light emitting diode of claim 1, wherein said AlGaInP lower cladding layer comprises $In_{0.5}(Ga_{1-x}Al_x)_{0.5}P$ with a doping concentration of $10^{17}$ ions/cm$^3$.

8. The AlGaInP light emitting diode of claim 1, wherein said AlGaInP upper cladding layer comprises $In_{0.5}(Ga_{1-x}Al_x)_{0.5}P$ with a doping concentration of $10^{17}$ ions/cm$^3$.

9. The AlGaInP light emitting diode of claim 1, wherein said AlGaInP layer comprises $In_{0.5}(Ga_{1-x}Al_x)_{0.5}P$ with a doping concentration not less than $10^{18}$ ions/cm$^3$.

10. The AlGaInP light emitting diode of claim 1, wherein said window layer comprises GaP.

11. An AlGaInP light emitting diode, comprising:

a GaAs substrate with a first conductivity;

an $AlAs/Al_xGa_{1-x}As$ light re-emitting layer with said first conductivity on said GaAs substrate;

an $In_{0.5}(Ga_{1-x}Al_x)_{0.5}P$ layer with said first conductivity and having a first doping concentration on said $AlAs/Al_xGa_{1-x}As$ light re-emitting layer;

an $In_{0.5}(Ga_{1-x}Al_x)_{0.5}P$ lower cladding layer with said first conductivity and having a second doping concentration less than said first doping concentration on said $In_{0.5}(Ga_{1-x}Al_x)_{0.5}P$ layer;

an undoped $In_{0.5}(Ga_{1-x}Al_x)_{0.5}P$ active layer on said $In_{0.5}(Ga_{1-x}Al_x)_{0.5}P$ lower cladding layer;

an $In_{0.5}(Ga_{1-x}Al_x)_{0.5}P$ upper cladding layer with a second conductivity opposite to said first conductivity on said undoped $In_{0.5}(Ga_{1-x}Al_x)_{0.5}P$ active layer;

a GaP window layer with said second conductivity on said $In_{0.5}(Ga_{1-x}Al_x)_{0.5}P$ upper cladding layer;

an annular-shaped top electrode with said second conductivity on said GaP window layer; and a layered electrode with said first conductivity on a bottom of said semiconductor substrate, wherein said $In_{0.5}(Ga_{1-x}Al_x)_{0.5}P$ layer with said first conductivity and said first doping concentration has a thickness not less than that of said $In_{0.5}(Ga_{1-x}Al_x)_{0.5}P$ lower cladding layer.

12. The AlGaInP light emitting diode of claim 11, wherein further comprises an annular-shaped $Al_2O_3$ region on a peripheral region of said $AlAs/Al_xGa_{1-x}As$ light re-emitting layer.

13. The AlGaInP light emitting diode of claim 11, wherein said $AlAs/Al_xGa_{1-x}As$ light re-emitting layer comprises a first region formed of $AlAs/Al_xGa_{1-x}As$ and a second region formed of $Al_2O_3$ enclosing said first region.

14. The AlGaInP light emitting diode of claim 11, wherein said $AlAs/Al_xGa_{1-x}As$ light re-emitting layer comprises a first region formed of $Al_2O_3$ and a plurality of second regions of $AlAs/Al_xGa_{1-x}As$ formed in said first regions.

15. The AlGaInP light emitting diode of claim 11, wherein said first conductivity comprises either of N type and P type conductivity.

* * * * *